US011735457B2

(12) United States Patent
Takada et al.

(10) Patent No.: US 11,735,457 B2
(45) Date of Patent: Aug. 22, 2023

(54) SUBSTRATE PROCESSING APPARATUS AND SUBSTRATE PROCESSING METHOD

(71) Applicant: Ebara Corporation, Tokyo (JP)

(72) Inventors: Nobuyuki Takada, Tokyo (JP); Hozumi Yasuda, Tokyo (JP)

(73) Assignee: Ebara Corporation, Tokyo (JP)

( * ) Notice: Subject to any disclaimer, the term of this patent is extended or adjusted under 35 U.S.C. 154(b) by 312 days.

(21) Appl. No.: 17/126,447

(22) Filed: Dec. 18, 2020

(65) Prior Publication Data

US 2021/0193494 A1 Jun. 24, 2021

(30) Foreign Application Priority Data

Dec. 20, 2019 (JP) .................. 2019-230480

(51) Int. Cl.
| | |
|---|---|
| *H01L 21/68* | (2006.01) |
| *B24B 37/20* | (2012.01) |
| *H01L 21/306* | (2006.01) |
| *H01L 21/66* | (2006.01) |

(52) U.S. Cl.
CPC ............ *H01L 21/681* (2013.01); *B24B 37/20* (2013.01); *H01L 21/30625* (2013.01); *H01L 22/10* (2013.01)

(58) Field of Classification Search
CPC ..... B24B 37/20; B24B 27/0076; B24B 37/30; B24B 49/04; H01L 22/10; H01L 21/67092; H10N 30/086
See application file for complete search history.

(56) References Cited

U.S. PATENT DOCUMENTS

| | | | |
|---|---|---|---|
| 5,888,120 A * | 3/1999 | Doran ................... | B24B 37/005 451/287 |
| 6,180,020 B1 * | 1/2001 | Moriyama .............. | B24B 37/04 257/E21.244 |
| 6,752,697 B1 * | 6/2004 | Stoeckgen ............ | B24B 53/017 451/36 |
| 11,574,804 B2 * | 2/2023 | Watanabe ......... | H01L 21/67253 |

(Continued)

FOREIGN PATENT DOCUMENTS

| | | |
|---|---|---|
| JP | 2003-229388 A | 8/2003 |
| JP | 2021122902 A * | 8/2021 |

*Primary Examiner* — Jarrett J Stark
(74) *Attorney, Agent, or Firm* — Leydig, Voit & Mayer, Ltd.

(57) ABSTRACT

To improve uniformity in polishing of a polished surface of a substrate regardless of a tolerance of a diameter of the substrate. A substrate processing apparatus includes a table 100, a pad holder 226, a swing mechanism, a supporting member 300A, 300B, a measuring instrument 400, and a driving mechanism 320. The table 100 supports a substrate WF. The pad holder 226 holds a polishing pad 222. The polishing pad 222 polishes the substrate WF supported to the table 100. The swing mechanism swings the pad holder 226. The supporting member 300A, 300B supports the polishing pad 222 swung to outside the table 100 by the swing mechanism. The measuring instrument 400 is configured to measure a diameter of the substrate WF. The driving mechanism 320 adjusts a position of the supporting member 300A, 300B with respect to the substrate WF supported to the table 100 according to the diameter of the substrate WF measured by the measuring instrument 400.

8 Claims, 10 Drawing Sheets

(56) References Cited

U.S. PATENT DOCUMENTS

| | | | |
|---|---|---|---|
| 2006/0057940 A1* | 3/2006 | Moriyama | B24B 41/04 451/287 |
| 2009/0176441 A1* | 7/2009 | Stinson | B24B 53/017 451/5 |
| 2009/0270015 A1* | 10/2009 | D'Ambra | B24B 41/005 451/28 |
| 2011/0021115 A1 | 1/2011 | Oh et al. | |
| 2011/0171882 A1* | 7/2011 | Ahn | B24B 49/12 451/5 |
| 2013/0210324 A1* | 8/2013 | Kosuge | B24B 37/04 451/72 |
| 2013/0337722 A1* | 12/2013 | Namiki | B24B 37/013 451/41 |
| 2014/0004772 A1* | 1/2014 | Ishii | B24B 37/30 451/539 |
| 2014/0295737 A1* | 10/2014 | Kosuge | B24B 49/00 451/8 |
| 2021/0237221 A1* | 8/2021 | Takada | B24B 37/042 |
| 2022/0219283 A1* | 7/2022 | Shibue | B24B 37/013 |

\* cited by examiner

SUBSTRATE PROCESSING APPARATUS AND SUBSTRATE PROCESSING METHOD

TECHNICAL FIELD

This application relates to a substrate processing apparatus and a substrate processing method. This application claims priority from Japanese Patent Application No. 2019-230480 filed on Dec. 20, 2019. The entire disclosure including the descriptions, the claims, the drawings, and the abstract in Japanese Patent Application No. 2019-230480 is herein incorporated by reference.

BACKGROUND ART

There is a Chemical Mechanical Polishing (CMP) apparatus as one kind of a substrate processing apparatus used for a semiconductor processing process. The CMP apparatus can be roughly classified into "a face-up type (a system in which a polished surface of a substrate facing upward)" and "a face-down type (a system in which a polished surface of a substrate facing downward)" depending on a direction that the polished surface of the substrate faces.

PTL 1 (Japanese Unexamined Patent Application Publication No. 2003-229388) discloses a face-up type CMP apparatus that brings a polishing pad having a diameter smaller than that of a substrate in contact with the substrate and swings the polishing pad while rotating the polishing pad to polish the substrate. PTL 1 discloses that this CMP apparatus includes supporting members at a peripheral area of the substrate, and the supporting members support a part of the polishing pad protruding from the substrate when the polishing pad is swung to outside the substrate and are movable in a radial direction of the substrate.

CITATION LIST

Patent Literature

PTL 1: Japanese Unexamined Patent Application Publication No. 2003-229388

SUMMARY OF INVENTION

Technical Problem

However, the technique described in PTL 1 has a room for improvement in uniformly polishing a polished surface of the substrate regardless of a tolerance of a diameter of the substrate. That is, although a process target of a substrate processing apparatus is a substrate having a predetermined size determined by a standard, actually, the tolerance (variation) is present in the diameter of the substrate.

In contrast to this, in the movement of the supporting member in PTL 1, the supporting member is moved to a position far from the substrate so as not to be a hindrance during loading of the substrate and moved to a position close to the substrate when the loading ends. Accordingly, the technique described in PTL 1 does not consider the tolerance of the diameter of the substrate, and therefore, when the tolerance is present in the diameter of the substrate, disposing the supporting member at an appropriate position is difficult. This possibly results in a loss of uniformity in polishing of the polished surface of the substrate.

Therefore, one object of this application is to improve uniformity in polishing of a polished surface of a substrate regardless of a tolerance of a diameter of the substrate.

Solution to Problem

There is disclosed a substrate processing apparatus according to one embodiment that includes a table, a pad holder, a swing mechanism, a supporting member, a measuring instrument, and a driving mechanism. The table supports a substrate. The pad holder holds a polishing pad. The polishing pad polishes the substrate supported to the table. The swing mechanism swings the pad holder. The supporting member supports the polishing pad swung to outside the table by the swing mechanism. The measuring instrument is configured to measure a diameter of the substrate. The driving mechanism adjusts a position of the supporting member with respect to the substrate supported to the table according to the diameter of the substrate measured by the measuring instrument.

DESCRIPTION OF EMBODIMENTS

The following describes embodiments of a substrate processing apparatus according to the present invention with reference to the attached drawings. In the attached drawings, identical or similar reference numerals are attached to identical or similar components, and overlapping description regarding the identical or similar components may be omitted in the description of the respective embodiments. Features illustrated in the respective embodiments are applicable to other embodiments in so far as they are consistent with one another.

Figure 1:
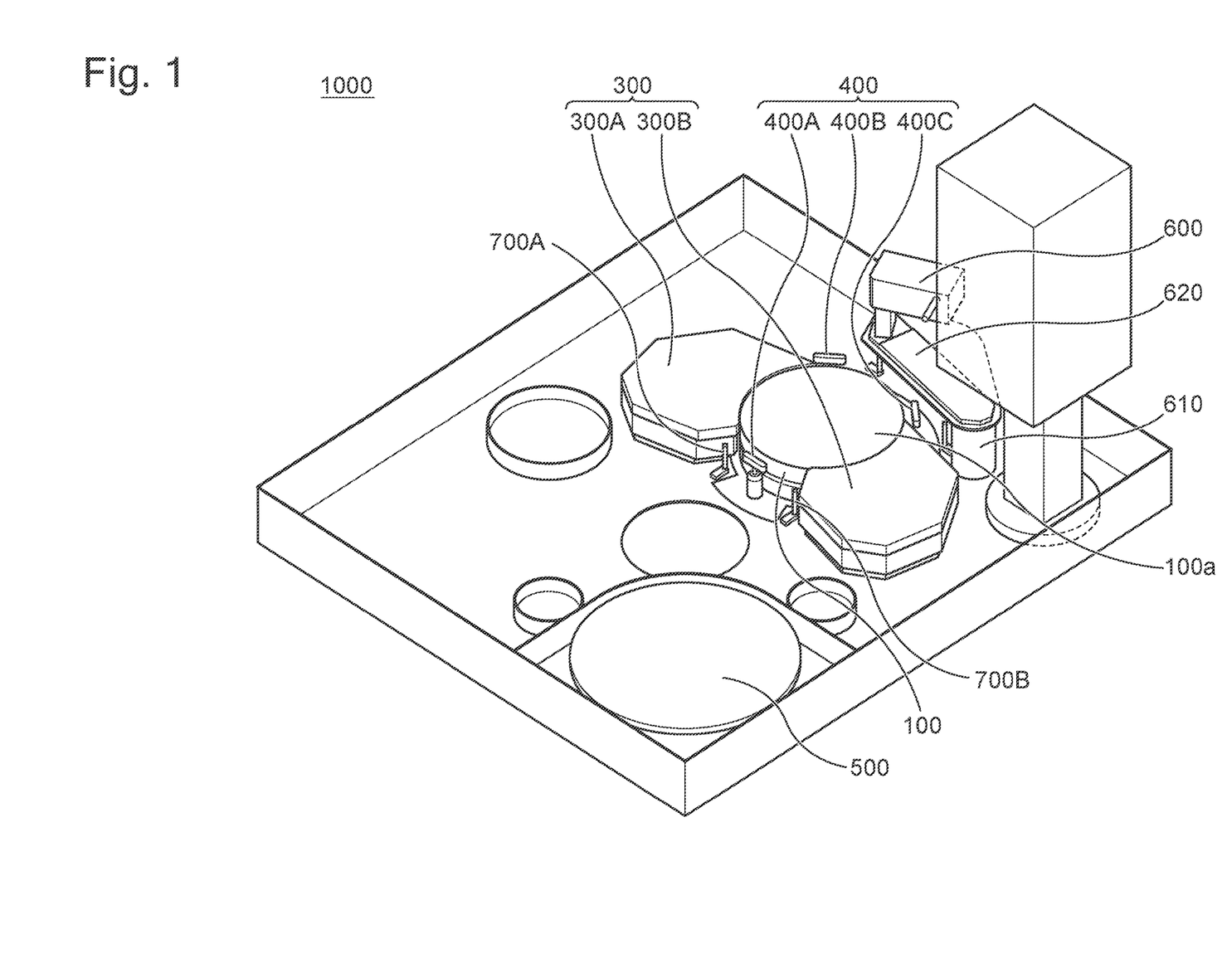
FIG. 1 is a perspective view schematically illustrating an overall configuration of a substrate processing apparatus according to one embodiment.
Figure 2:
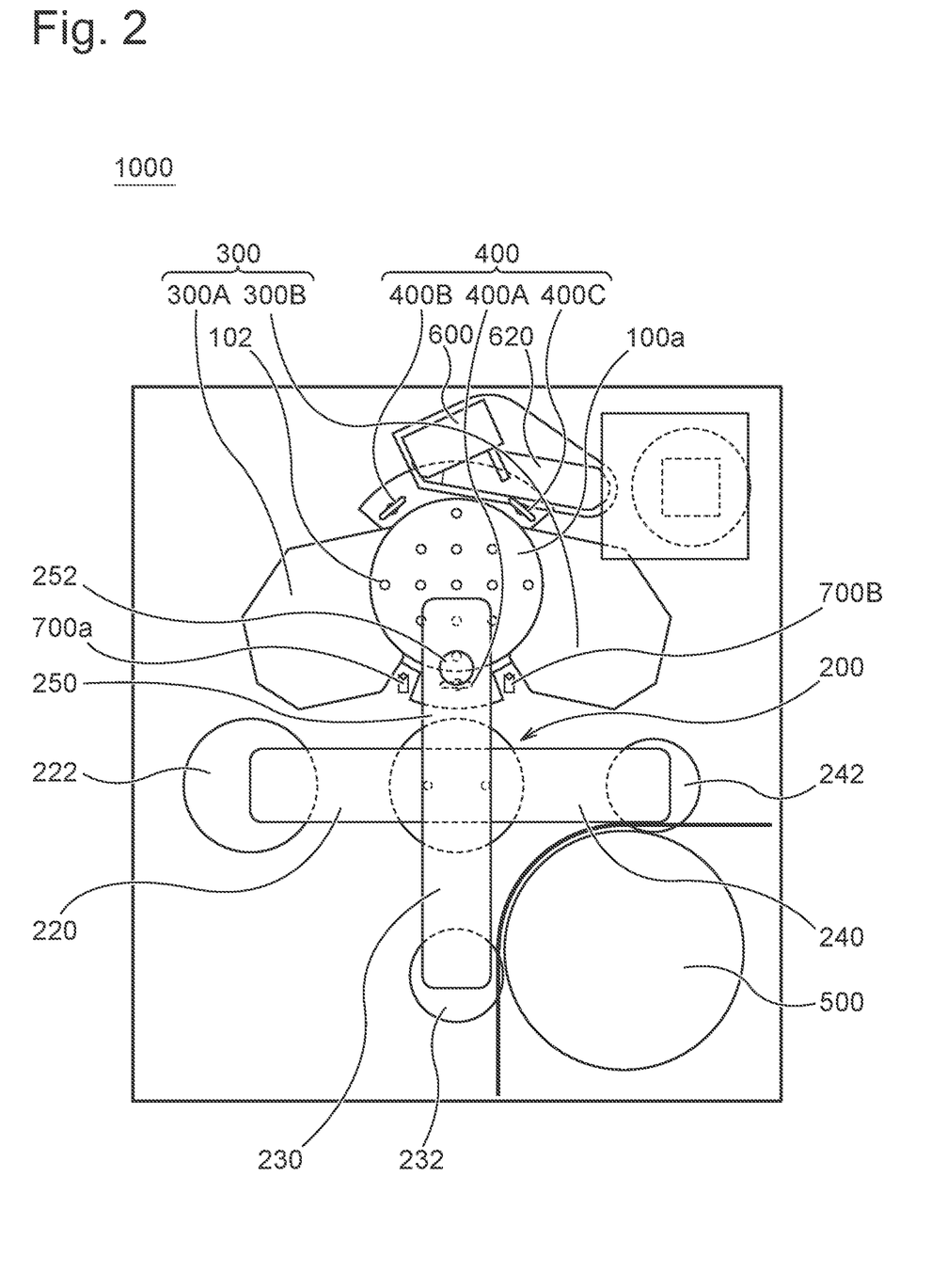
FIG. 2 is a plan view schematically illustrating an overall configuration of the substrate processing apparatus according to the one embodiment.

FIG. 1 is a perspective view schematically illustrating an overall configuration of the substrate processing apparatus according to one embodiment. FIG. 2 is a plan view schematically illustrating an overall configuration of the substrate processing apparatus according to the one embodiment. A substrate processing apparatus 1000 illustrated in FIG. 1 and FIG. 2 includes a table 100, a multi-axis arm 200, supporting members 300A, 300B, measuring instrument 400

(centering mechanisms 400A, 400B, 400C), a dresser 500, an end point detector 600, and cleaning nozzles 700A, 700B.

<Table>

The table 100 is a member to support a substrate WF as a process target. In one embodiment, the table 100 includes a support surface 100a that supports the substrate WF and is rotatable by a driving mechanism, such as a motor (not illustrated). The support surface 100a has a plurality of holes 102, and the table 100 is configured to perform vacuum suction on the substrate WF via the holes 102.

<Multi-Axis Arm>

Figure 3:
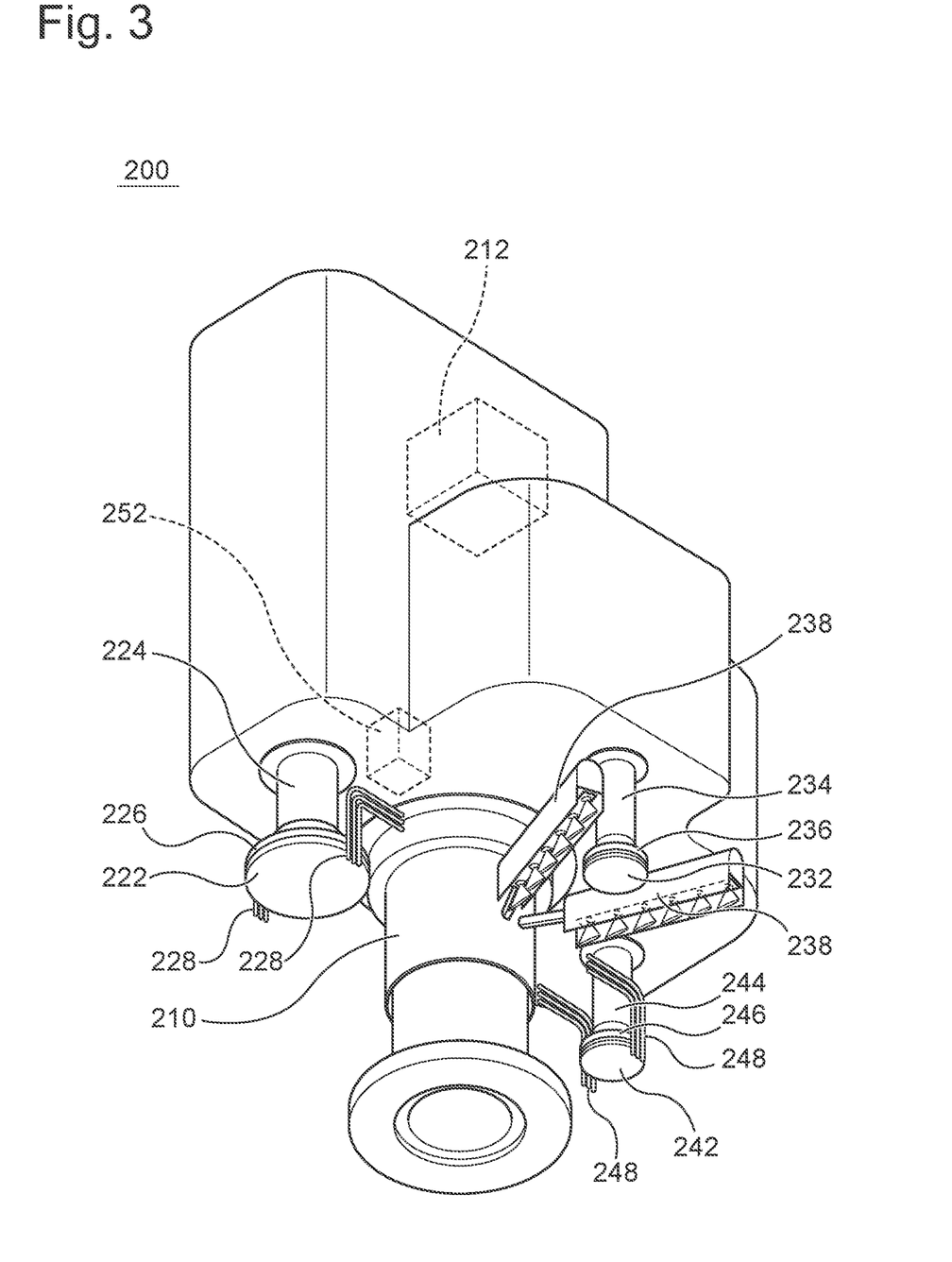
FIG. 3 is a perspective view schematically illustrating a multi-axis arm according to the one embodiment.

FIG. 3 is a perspective view schematically illustrating the multi-axis arm according to the one embodiment. As illustrated in FIG. 2 and FIG. 3, the multi-axis arm 200 is a member that holds a plurality of processing tools for various processes on the substrate WF supported to the table 100 and is disposed adjacent to the table 100. The multi-axis arm 200 of this embodiment holds a large-diameter polishing pad 222 to polish the substrate WF, a cleaning tool 232 to clean the substrate WF, a small-diameter polishing pad 242 for finish polishing of the substrate WF, and an imaging member (camera) 252 to measure a diameter of the substrate WF.

Specifically, the multi-axis arm 200 includes a swing shaft 210 extending in a direction perpendicular to the substrate WF (height direction), a rotation drive mechanism 212, such as the motor, that rotatably drives the swing shaft 210, a first arm 220, a second arm 230, a third arm 240, and a fourth arm 250 supported to the swing shaft 210 and radially arranged around swing shaft 210. To the first arm 220, a pad holder 226 is mounted via a rotation shaft 224, which extends in the height direction, and the large-diameter polishing pad 222 is held to the pad holder 226. To the second arm 230, a cleaning tool holder 236 is mounted via a rotation shaft 234, which extends in the height direction, and the cleaning tool 232 is held to the cleaning tool holder 236. To the third arm 240, a pad holder 246 is mounted via a rotation shaft 244, which extends in the height direction, and the small-diameter polishing pad 242 is held to the pad holder 246. To the fourth arm 250, the imaging member 252 is held.

The first arm 220 further holds nozzles 228 in addition to the polishing pad 222. The nozzles 228 are disposed on both sides in the swinging direction of the polishing pad 222 between which the polishing pad 222 is interposed to discharge a polishing liquid or cleaning water to the substrate WF. The second arm 230 further holds atomizers 238 in addition to the cleaning tool 232. The atomizers 238 are disposed on both sides in the swinging direction of the cleaning tool 232 between which the cleaning tool 232 is interposed to discharge a liquid, such as pure water, to the substrate WF. The third arm 240 further holds nozzles 248 in addition to the polishing pad 242. The nozzles 248 are disposed on both sides in the swinging direction of the polishing pad 242 between which the polishing pad 242 is interposed to discharge a polishing liquid or cleaning water to the substrate WF.

As illustrated in FIG. 2, in this embodiment, the first arm 220, the second arm 230, the third arm 240, and the fourth arm 250 radially extend around the swing shaft 210 while being displaced counterclockwise by 90 degrees in plan view. Rotatably driving the swing shaft 210 by the rotation drive mechanism 212 allows moving any of the large-diameter polishing pad 222, the cleaning tool 232, the small-diameter polishing pad 242, and the imaging member 252 on the substrate WF. Rotatably driving the swing shaft 210 by the rotation drive mechanism 212 allows moving the polishing pad 222 or the polishing pad 242 on the dresser 500. The rotation drive mechanism 212 has a function of a swing mechanism that rotatably drives the swing shaft 210 clockwise and counterclockwise in alternation to swing the first arm 220, the second arm 230, the third arm 240, and the fourth arm 250. Specifically, the rotation drive mechanism 212 rotatably drives the swing shaft 210 clockwise and counterclockwise in alternation with the polishing pad 222, the cleaning tool 232, or the polishing pad 242 positioned on the substrate WF to allow the polishing pad 222, the cleaning tool 232, or the polishing pad 242 to swing with respect to the substrate WF. Although this embodiment describes an example in which the polishing pad 222, the cleaning tool 232, or the polishing pad 242 is turned and swung in the radial direction of the substrate WF, that is, moved in a reciprocating manner along an arc by the rotation drive mechanism 212, the configuration is not limited to this. For example, the swing mechanism can have a configuration that linearly swings the polishing pad 222, the cleaning tool 232, or the polishing pad 242 in the radial direction of the substrate, that is, moves it in a reciprocating manner along a straight line.

The multi-axis arm 200 includes the rotation drive mechanism, such as the motor (not illustrated) to rotate the rotation shafts 224, 234, 244. This allows the polishing pad 222, the cleaning tool 232, and the polishing pad 242 to rotate with the rotation shafts 224, 234, 244 as axes. For example, when the polishing pad 222 is on the substrate WF, the substrate processing apparatus 1000 rotates the table 100 and rotates the polishing pad 222, and swings the polishing pad 222 while pushing the polishing pad 222 to the substrate WF to polish the substrate WF.

<Supporting Members>

As illustrated in FIG. 1 and FIG. 2, the substrate processing apparatus 1000 includes a first supporting member 300A disposed on a swing path of the polishing pad 222 outside the table 100 and a second supporting member 300B disposed on a swing path of the polishing pad 222 on a side opposite to the first supporting member 300A between which the table 100 is interposed. The first supporting member 300A and the second supporting member 300B are linearly symmetrical between which the substrate WF is interposed. In view of this, the following will collectively describe the first supporting member 300A and the second supporting member 300B as the supporting members 300. Although the following will give a description on the function of the supporting members 300 when the large-diameter polishing pad 222 is swung with respect to the substrate WF as an example, the same applies to the cleaning tool 232 or the small-diameter polishing pad 242.

The supporting members 300 are members to support the polishing pad 222 swung to outside the table 100 by the rotation of the swing shaft 210. That is, the substrate processing apparatus 1000 is configured to swing (overhang) the polishing pad 222 until the polishing pad 222 projects to the outside of the substrate WF in polishing the substrate WF to uniformly polish a polished surface of the substrate WF. Here, when the polishing pad 222 is overhung, due to various factors, such as an inclination of the pad holder 226, a pressure of the polishing pad 222 concentrates on the periphery of the substrate WF, possibly failing to uniformly polish the polished surface of the substrate WF. Therefore, the substrate processing apparatus 1000 of this embodiment includes the supporting members 300 to support the polishing pad 222 overhung to the outside of the substrate WF on both sides of the table 100.

Figure 4:
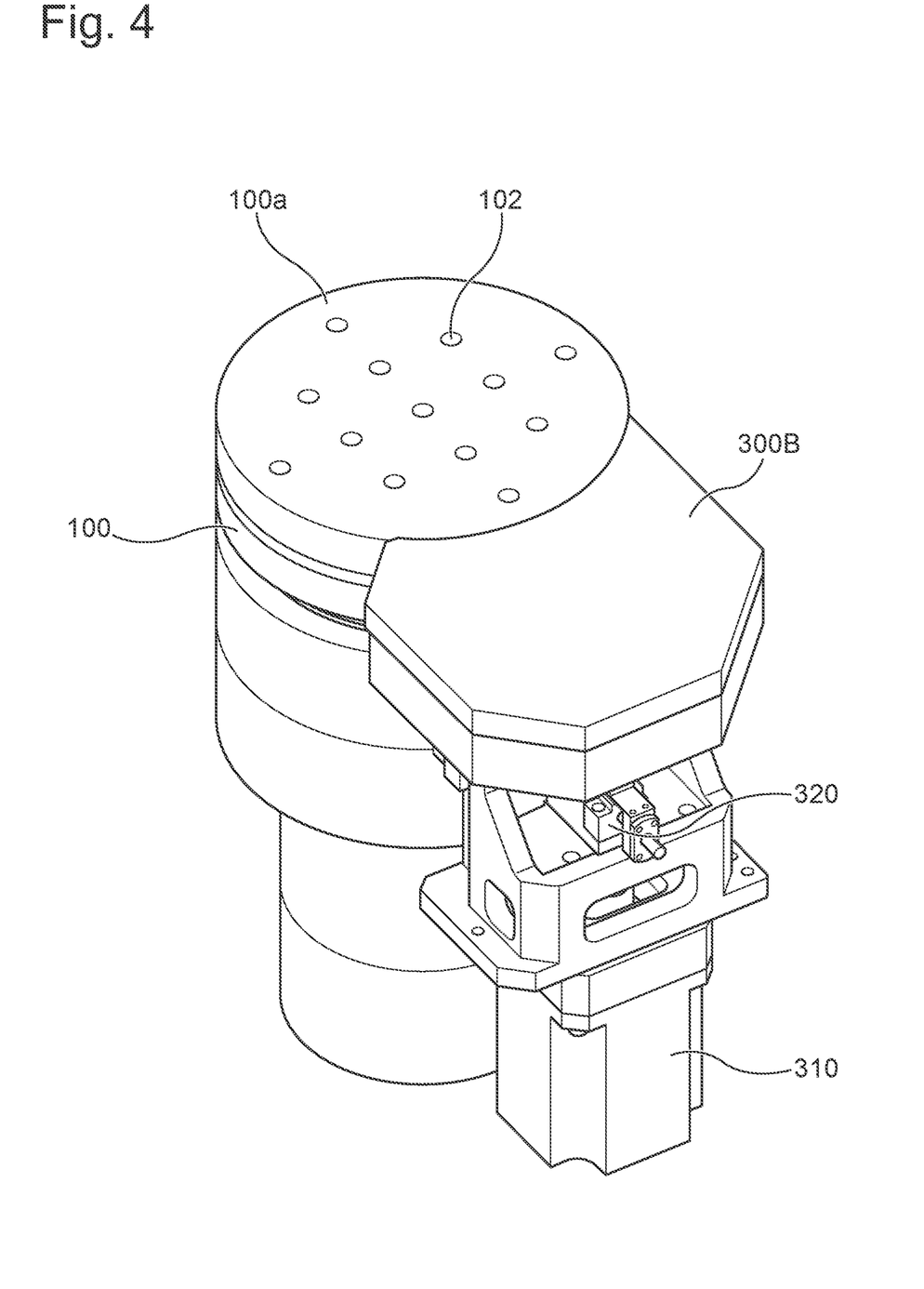
FIG. 4 is a perspective view schematically illustrating a table and a supporting member according to the one embodiment.
Figure 5:
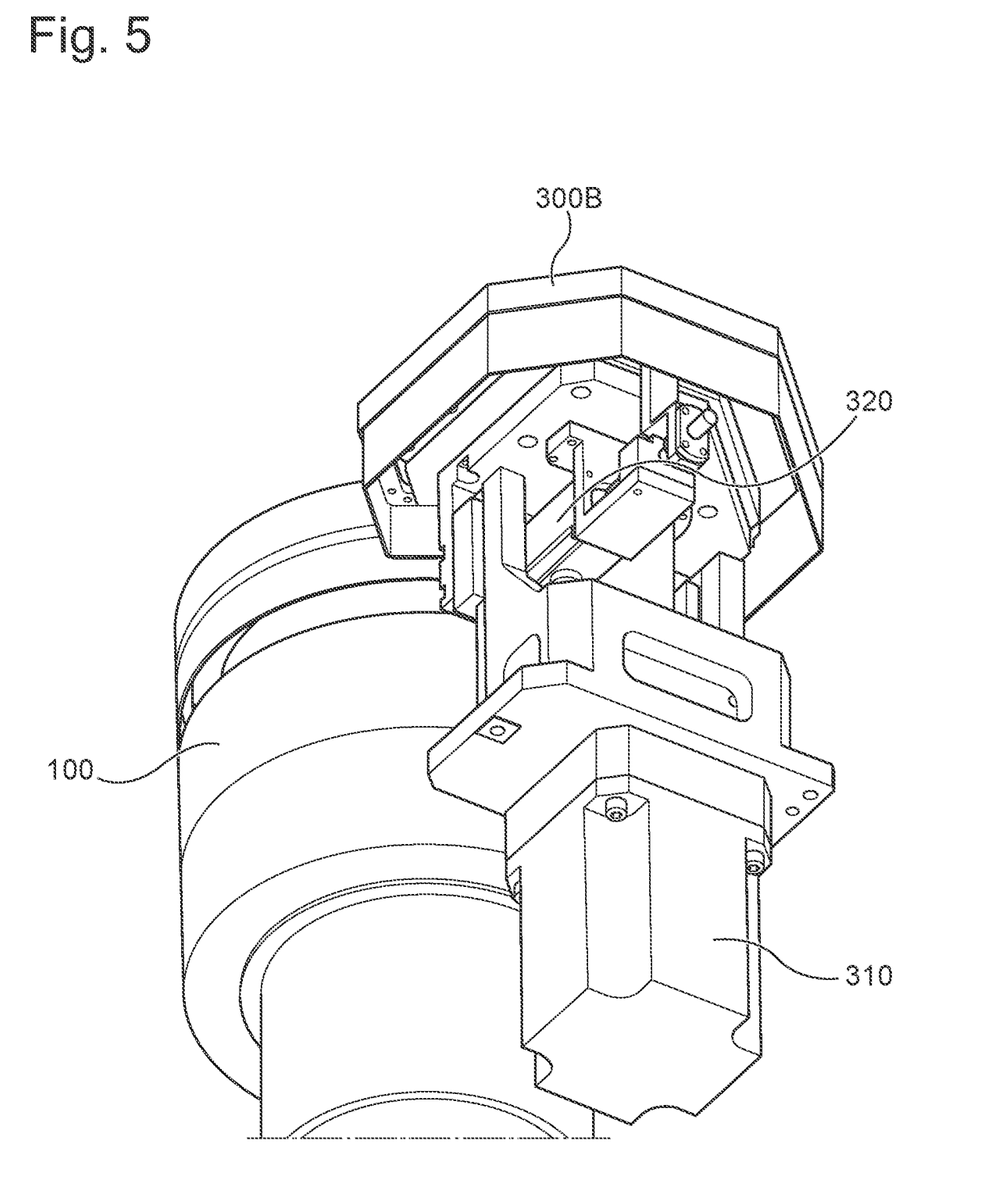
FIG. 5 is a perspective view schematically illustrating the table and the supporting member according to one embodiment.
Figure 6:
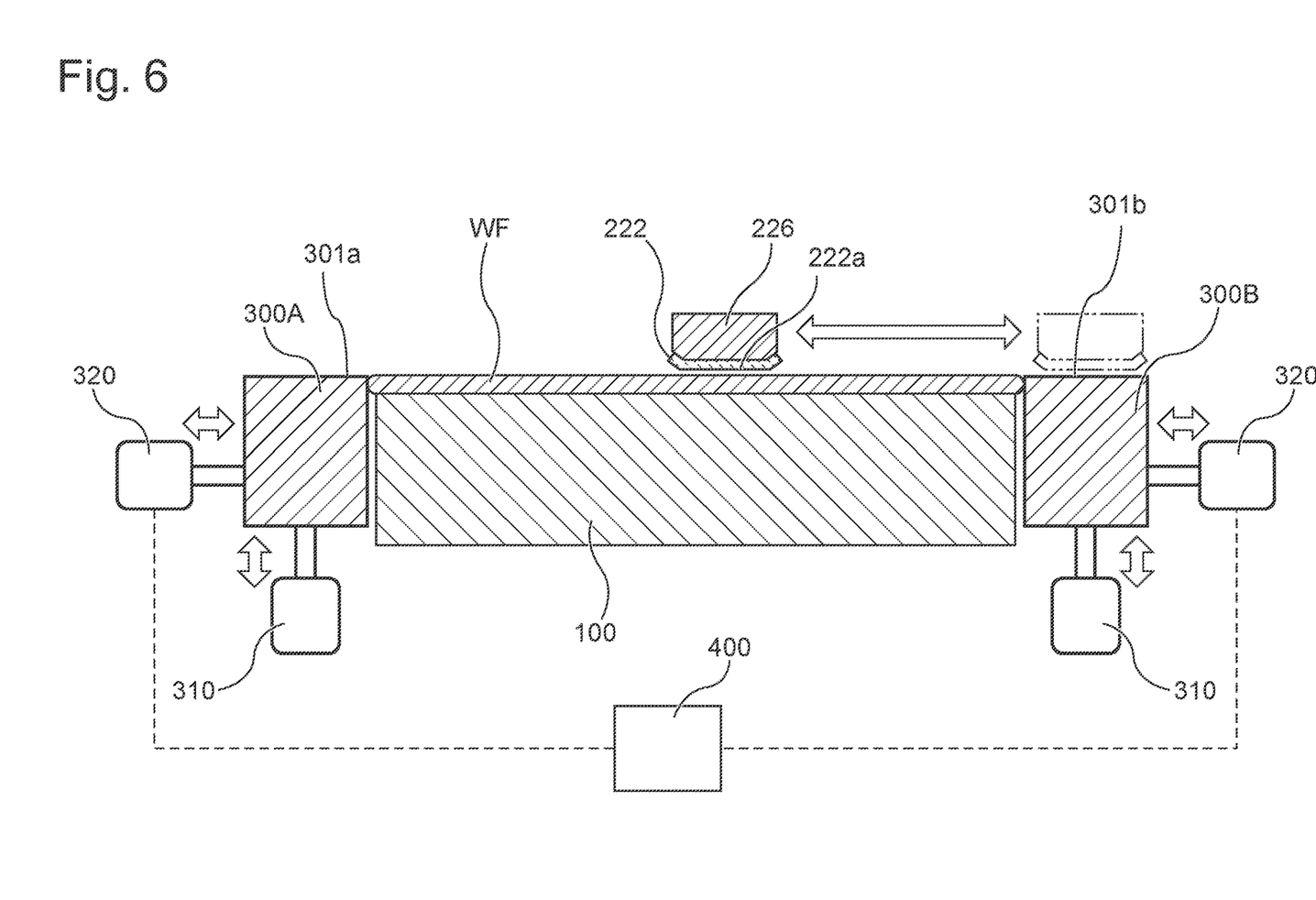
FIG. 6 is a side view schematically illustrating the table and the supporting members according to the one embodiment.

FIG. 4 and FIG. 5 are perspective views schematically illustrating a table and a supporting member according to the one embodiment. FIG. 6 is a side view schematically illustrating the table and the supporting members according to the one embodiment. As illustrated in FIG. 6, the supporting members 300 (which are the first supporting member 300A and the second supporting member 300B) include support surfaces 301a, 301b that can support an entire polishing surface 222a of the polishing pad 222 in contact with the substrate WF, respectively. That is, the support surfaces 301a, 301b each have an area larger than an area of the polishing surface 222a of the polishing pad 222, and therefore even when the polishing pad 222 is overhung up to completely outside the substrate WF, the support surfaces 301a, 301b support the entire polishing surface 222a. Thus, in this embodiment, when the polishing pad 222 swings on the substrate WF, the entire polishing surface 222a is in contact with the substrate WF while being supported, and when the polishing pad 222 swings up to the outside of the table 100 as well, the entire polishing surface 222a is supported to the supporting members 300. Accordingly, the polishing pad 222 does not protrude from the polished surface of the substrate WF or the regions of the support surfaces 301a, 301b during swinging. As illustrated in FIG. 4 to FIG. 6, the substrate processing apparatus 1000 includes a driving mechanism 310 to adjust heights of the supporting members 300. The driving mechanisms 310 can be configured by various known mechanisms, such as a motor and a ball screw, and can adjust the supporting members 300 so as to be desired heights. The substrate processing apparatus 1000 includes a driving mechanism 320 to adjust positions of the supporting members 300 in the horizontal direction, that is, positions of the supporting members 300 with respect to the substrate WF supported to the table 100. The driving mechanism 320 can be configured by various mechanisms, such as a motor and a ball screw.

The driving mechanism 320 can adjust the positions of the supporting members 300 in the horizontal direction according to the diameter of the substrate WF obtained by a method described later. That is, to uniformly polish the polished surface of the substrate WF, absence of a gap between the substrate WF and the supporting members 300 is preferred. However, while the substrate WF rotates in association with the rotation of the table 100 during the polishing process of the substrate WF, the supporting members 300 do not rotate, and therefore the supporting members 300 cannot contact the outer peripheral portion of the substrate WF. Therefore, the supporting members 300 are preferably disposed at positions close to the outer peripheral portion of the substrate WF as much as possible within a range not in contact with the outer peripheral portion of the substrate WF. Here, although the process target of the substrate processing apparatus 1000 is the substrate WF having a predetermined size determined by the standard, actually, the tolerance (variation) is present in the diameter of the substrate WF. The variation in the diameter of the substrate WF differentiates optimal disposed positions of the supporting members 300. In contrast to this, according to this embodiment, the positions of the supporting members 300 in the horizontal direction can be adjusted according to the actual diameter of the substrate WF, and therefore the supporting members 300 can be disposed at the positions close to the outer peripheral portion of the substrate WF. Consequently, according to this embodiment, the pressure concentration of the polishing pad 222 on the periphery of the substrate WF can be suppressed. Thus, even when the tolerance is present in the diameter of the substrate WF, the uniformity in the polishing of the polished surface of the substrate WF can be improved.

<Centering Mechanisms and Measuring Instrument>

As illustrated in FIG. 1 and FIG. 2, the substrate processing apparatus 1000 includes the measuring instrument 400 to measure the diameter of the substrate WF. In this embodiment, the measuring instrument 400 includes at least the three centering mechanisms 400A, 400B, 400C to push the substrate WF supported to the table 100 in the center direction of the table 100 for positioning. The centering mechanisms 400A, 400B, 400C are disposed around the table 100 at appropriate intervals. The measuring instrument 400 calculates the diameter of the substrate WF based on the positioning result of the substrate WF by the centering mechanisms 400A, 400B, 400C.

Figure 7:
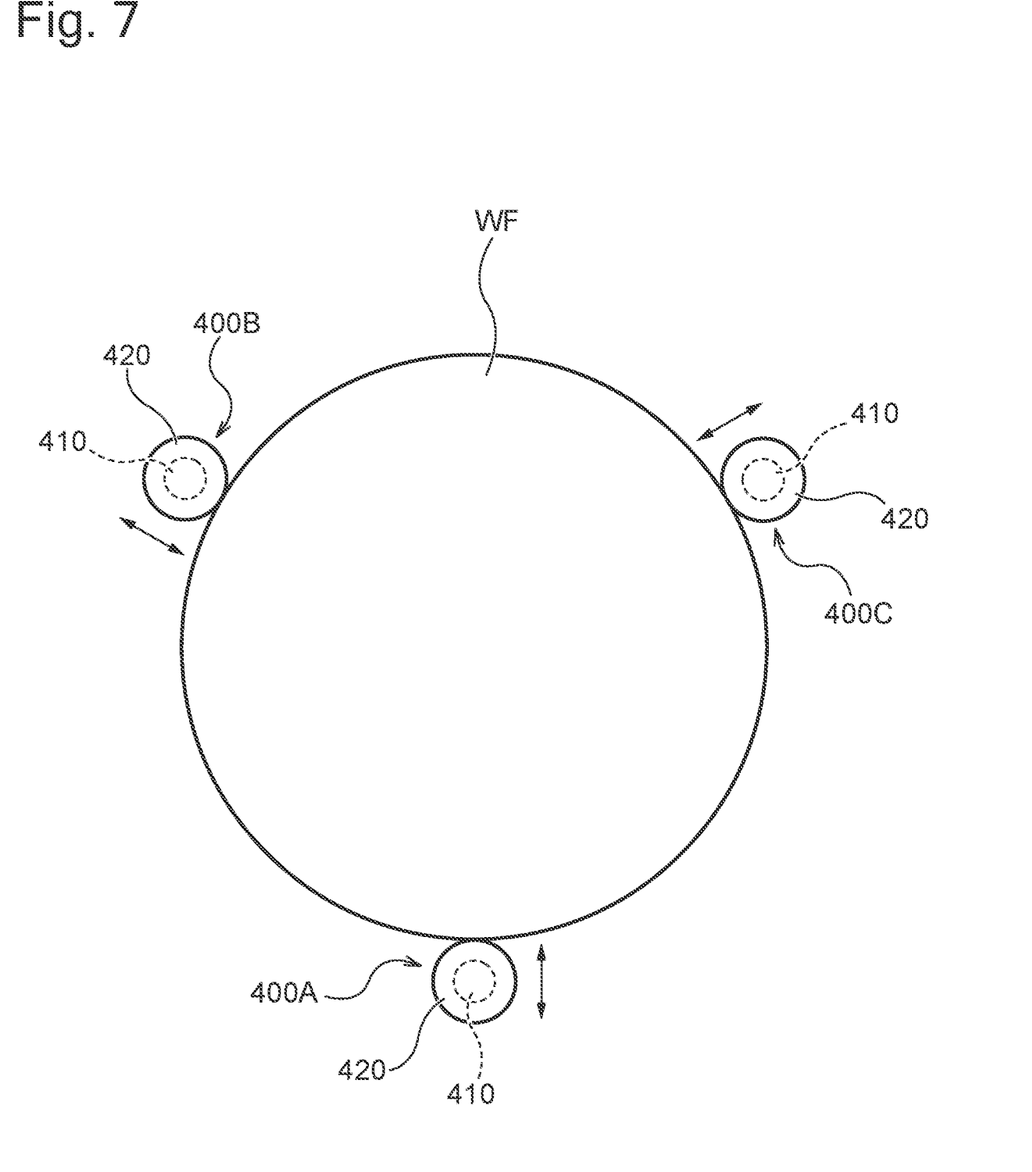
FIG. 7 is a plan view schematically illustrating centering mechanisms according to the one embodiment.

This point will be described in detail using FIG. 7. FIG. 7 is a plan view schematically illustrating the centering mechanisms according to the one embodiment. As illustrated in FIG. 7, the centering mechanisms 400A, 400B, 400C each include a shaft 410, which is disposed around the table 100 and extends in the height direction and a centering member 420 mounted to the shaft 410 at a height position same as that of the substrate WF. The shaft 410 is movable in a direction of approaching or a direction of away from the table 100 by the driving mechanism, such as the motor (not illustrated).

The measuring instrument 400 calculates the diameter of the substrate WF based on movement amounts of the shafts 410 when the substrate WF is positioned. That is, when the substrate WF is installed to the table 100, the respective centering mechanisms 400A, 400B, 400C move the shafts 410 in the direction of approaching the substrate WF at the same timing. Then, the centering member closest to the substrate WF among the three centering members 420 pushes the substrate WF in the center direction of the table 100. Afterwards, the remaining centering members 420 also sequentially push the substrate WF in the center direction of the table 100, and as a result, the substrate WF is pushed in the center direction of the table 100 from the three directions. When the three centering members 420 equally push the substrate WF, the substrate WF is centered to the center position of the table 100 to be positioned.

The measuring instrument 400 includes a reference table to make the movement amounts of the shafts 410 correspond to the diameter of the substrate WF. That is, although the substrate WF has the predetermined size determined by the standard, actually, the tolerance (variation) is present in the diameter of the substrate WF. Therefore, the measuring instrument 400 preliminarily generates the reference table of a correspondence relationship between the movement amounts of the shafts 410 and the diameter of the substrate WF based on, for example, the movement amounts of the shafts 410 when the centering members 420 push the table 100 whose diameter is already known, and stores the reference table. The measuring instrument 400 derives the diameter corresponding to the movement amount of the shaft 410 when the substrate WF is positioned based on the stored reference table, thus ensuring calculating the diameter of the substrate W.

Figure 8:
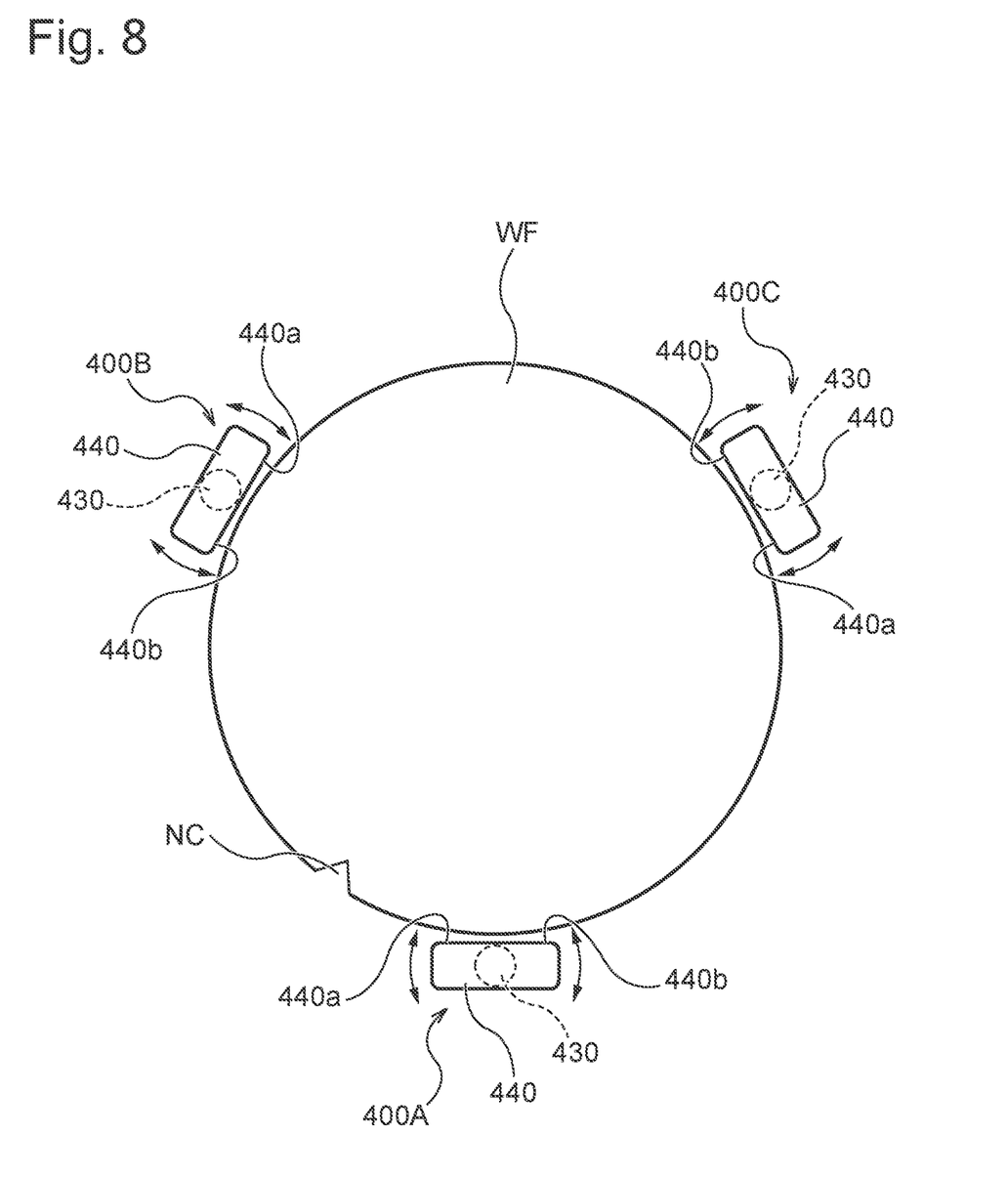
FIG. 8 is a plan view schematically illustrating centering mechanisms according to one embodiment.

Next, modifications of the centering mechanisms 400A, 400B, 400C will be described. FIG. 8 is a plan view schematically illustrating centering mechanisms according to one embodiment. As illustrated in FIG. 8, the centering mechanisms 400A, 400B, 400C each include a rotation shaft 430 extending in the height direction and a centering member 440 mounted to the rotation shaft 430. The rotation shaft 430 is rotatable by the rotation drive mechanism, such as the motor (not illustrated). The centering member 440 is a rod-shaped member mounted to the rotation shaft 430 at a height position same as that of the substrate WF and extends to both sides of the rotation shaft 430. The centering member 440 includes a first contact portion 440a that is in contact with the substrate WF when the rotation shaft 430 rotates in a first direction (for example, the clockwise direction) and a second contact portion 440b that is in contact with the substrate WF when the rotation shaft 430 rotates in a second direction (for example, the anticlockwise direction) opposite to the first direction.

The measuring instrument 400 calculates the diameter of the substrate WF based on rotation angles of the centering members 440 in the first direction or rotation angles of the centering members 440 in the second direction. That is, when the substrate WF is installed to the table 100, the respective centering mechanisms 400A, 400B, 400C rotate the rotation shafts 430 in the first direction at the same timing to push the substrate WF at the first contact portions 440a. Then, the first contact portion 440a of the centering member closest to the substrate WF among the three centering members 440 pushes the substrate WF in the center direction of the table 100. Afterwards, the first contact portions 440a of the remaining centering members 440 also sequentially push the substrate WF in the center direction of the table 100, and as a result, the substrate WF is pushed in the center direction of the table 100 from the three directions. When the first contact portions 440a of the three centering members 440 equally push the substrate WF, the substrate WF is centered to the center position of the table 100 to be positioned. Hereinafter, the positioning of the substrate WF by rotating the rotation shafts 430 in the first direction will be referred to as "first positioning."

Here, as illustrated in FIG. 8, a notch (cutout) NC is provided in the outer peripheral portion of the substrate WF. When any of the first contact portions 440a of the three centering members 440 pushes the notch NC, the positioning of the substrate WF is displaced from the center of the table 100 and the diameter of the substrate WF is not correctly calculated. Therefore, in this embodiment, after the first positioning is performed, the rotation shafts 430 are rotated in the second direction and the substrate WF is pushed with the second contact portions 440b to center the substrate WF at the center position of the table 100, thus ensuring the positioning. Hereinafter, the positioning of the substrate WF by rotating the rotation shafts 430 in the second direction will be referred to as "second positioning."

When any of the second contact portions 440b pushes the notch NC in the substrate WF in the second positioning, the positioning of the substrate WF is displaced. Accordingly, performing the first positioning again allows centering the substrate WF at the center position of the table 100. This is because anyone of the first contact portion 440a and the second contact portion 440b possibly pushes the notch NC, but there is no possibility that both push the notch NC. According to this embodiment, even when the notch NC is present in the outer peripheral portion of the substrate WF, the substrate WF can be reliably positioned at the center position of the table 100.

The measuring instrument 400 has the reference table to make the rotation angles in the first direction and the rotation angles in the second direction of the rotation shafts 430 correspond to the diameter of the substrate WF. That is, although the substrate WF has the predetermined size determined by the standard, actually, the tolerance (variation) is present in the diameter of the substrate WF. Therefore, the measuring instrument 400 preliminarily creates the reference table of the correspondence relation between the rotation angles of the rotation shafts 430 and the diameter of the substrate WF based on, for example, the rotation angles in the first direction and the rotation angles in the second direction of the rotation shafts 430 when the first contact portions 440a and the second contact portions 440b push the table 100 whose diameter is already-known, and stores the reference table. The measuring instrument 400 derives a diameter corresponding to the rotation angles in the first direction and the rotation angles in the second direction of the rotation shafts 430 when the substrate WF is positioned based on the stored reference table, thus ensuring calculating the diameter of the substrate WF.

Specifically, the measuring instrument 400 calculates the diameter (first diameter) of the substrate WF based on the reference table of the rotation angles in the first direction of the rotation shafts 430 when the first positioning is performed. Afterwards, the measuring instrument 400 calculates the diameter (second diameter) of the substrate WF based on the reference table of the rotation angles in the second direction of the rotation shafts 430 when the second positioning is performed. The measuring instrument 400 compares the first diameter and the second diameter. In a case where both are equal, it is considered that the notch NC in the substrate WF is not pushed whichever one of the first positioning and the second positioning is performed, and therefore the measuring instrument 400 outputs any of the first diameter or the second diameter as the diameter of the substrate WF. Meanwhile, in a case where the second diameter is greater than the first diameter, it is considered that the notch NC in the substrate WF is pushed when the first positioning is performed, and therefore the measuring instrument 400 outputs the second diameter as the diameter of the substrate WF. Meanwhile, when the first diameter is greater than the second diameter, it is considered that the notch NC in the substrate WF is pushed when the second positioning is performed, the measuring instrument 400 performs the first positioning again and outputs the first diameter as the diameter of the substrate WF. Thus, the measuring instrument 400 can calculate the diameter of the substrate WF using the rotation angles when the notch NC is not pushed among the rotation angles in the first direction and the rotation angles in the second direction of the rotation shafts 430.

Figure 9:
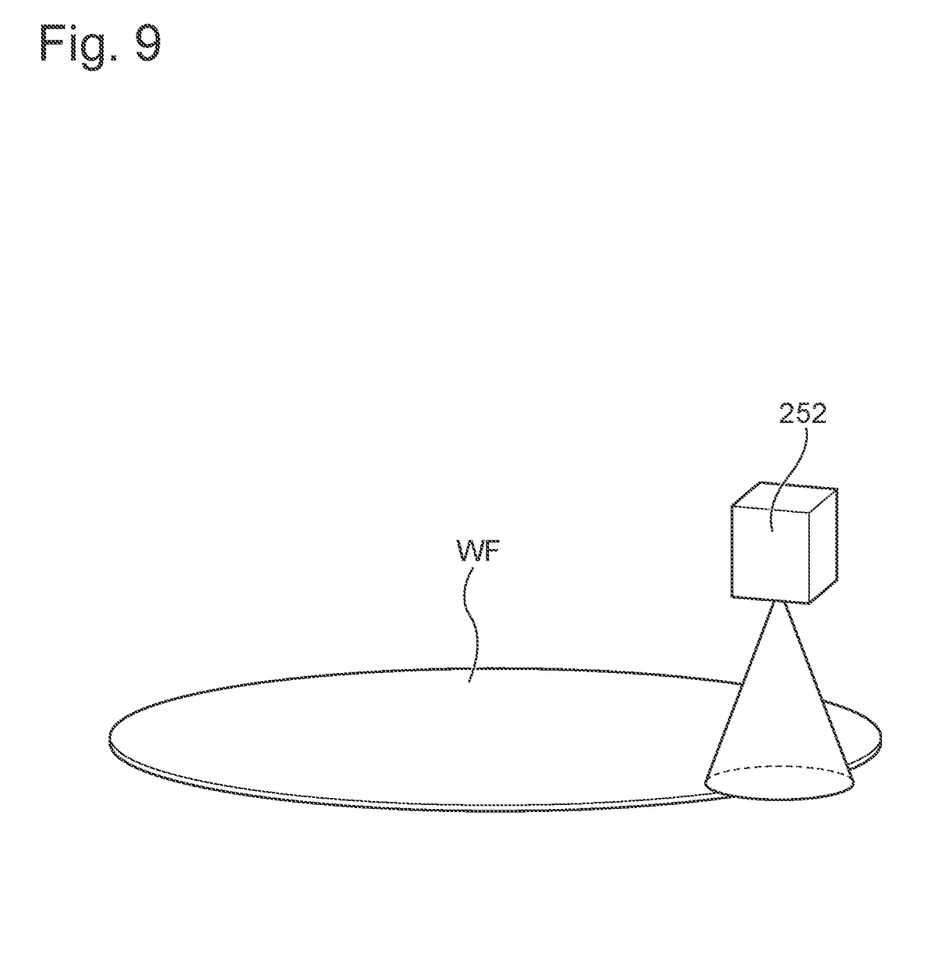
FIG. 9 is a side view schematically illustrating a measuring instrument according to one embodiment.

The above-described embodiments describe the example in which the measuring instrument 400 includes the centering mechanisms 400A, 400B, 400C, but the configuration is not limited to this. The measuring instrument 400 may include the above-described imaging member (camera) 252. FIG. 9 is a side view schematically illustrating a measuring instrument according to one embodiment. As illustrated in FIG. 2 and FIG. 9, the imaging member 252 is disposed at a position where an image of the outer peripheral portion of the substrate WF can be obtained. The imaging member 252 can obtain the image of the outer peripheral portion of the substrate WF and calculate the diameter of the substrate WF from a curvature of the outer peripheral portion of the substrate WF in the obtained image.

<Dresser>

As illustrated in FIG. 1 and FIG. 2, the dresser 500 is disposed on turning passages of the polishing pads 222, 242 by the rotation of the swing shaft 210. Diamond particles or the like are firmly electrodeposited on the surface of the dresser 500. The dresser 500 is a member to dress the polishing pads 222, 242. The dresser 500 is rotated by the rotation drive mechanism, such as the motor (not illustrated). Pure water can be supplied to the surface of the dresser 500 from a nozzle (not illustrated). The substrate processing apparatus 1000 rotates the dresser 500 while supplying pure water from the nozzle to the dresser 500, rotates the polishing pads 222, 242, and swings the polishing pads 222, 242 with respect to the dresser 500 while pushing the polishing pads 222, 242 to the dresser 500. Thus, the dresser 500 scrapes off the polishing pads 222, 242 to dress polishing surfaces of the polishing pads 222, 242.

<End Point Detector>

As illustrated in FIG. 1 and FIG. 2, the end point detector 600 is disposed adjacent to the table 100. The end point detector 600 can be configured by various sensors, such as an eddy current sensor or an optical sensor. The end point detector 600 is mounted to a swing arm 620, and the swing arm 620 is mounted to a rotation shaft 610 extending in the height direction. The rotation shaft 610 is rotatable by the rotation drive mechanism, such as the motor (not illustrated). The end point detector 600 can swing from the center to the outer periphery of the substrate WF during the polishing of the substrate WF by the rotation of the rotation shaft 610, thus ensuring detecting an ending point of the polishing of the substrate WF.

<Cleaning Nozzle>

As illustrated in FIG. 1 and FIG. 2, cleaning nozzles 700A, 700B are disposed adjacent to the table 100. The cleaning nozzle 700A supplies a cleaning liquid, such as pure water, to a clearance between the table 100 and the supporting member 300A. This allows washing away polishing scraping or the like that has entered between the table 100 and the supporting member 300A. The cleaning nozzle 700B supplies a cleaning liquid, such as pure water, to a clearance between the table 100 and the supporting member 300B. This allows washing away polishing scraping or the like that has entered between the table 100 and the supporting member 300B.

<Flowchart>

Figure 10:
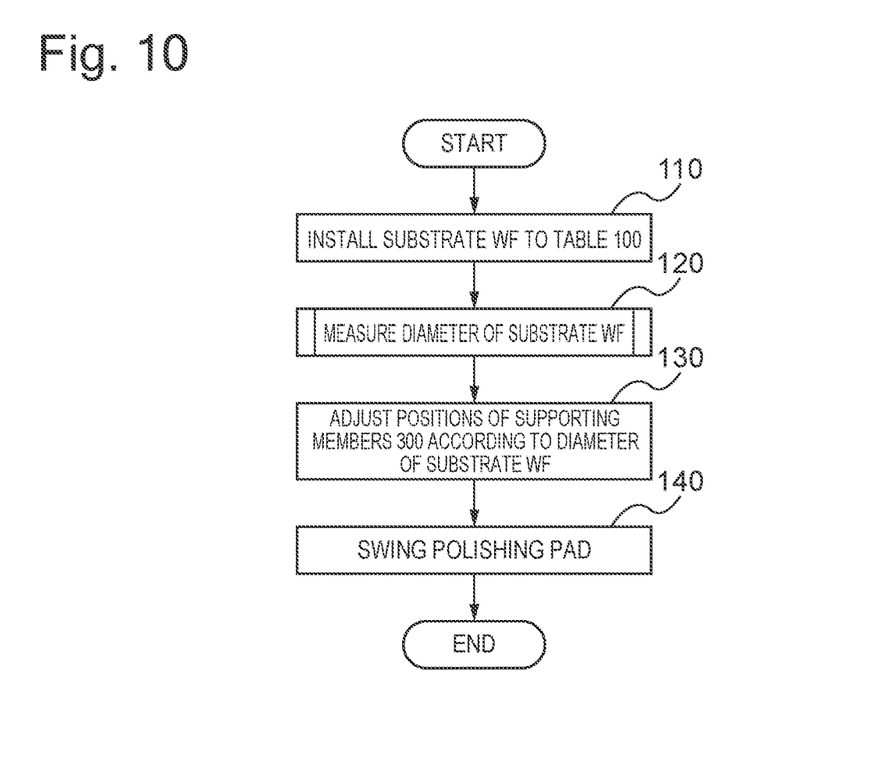
FIG. 10 is a flowchart depicting a substrate processing method according to one embodiment.

Next, a procedure for a substrate processing method including the adjustment of the horizontal positions of the supporting members 300 according to this embodiment. FIG. 10 is a flowchart depicting the substrate processing method according to one embodiment. As illustrated in FIG. 10, the substrate processing method first installs the substrate WF to the table 100 (installing step 110). Subsequently, the substrate processing method measures the diameter of the substrate WF (measuring step 120). Details of the measuring step 120 will be described later.

Subsequently, the substrate processing method adjusts the positions of the supporting members 300 with respect to the substrate WF installed to the table 100 according to the diameter of the substrate WF measured by the measuring step 120 (adjusting step 130). Specifically, the adjusting step 130 disposes the supporting members 300 at the closest positions within a range not in contact with the outer peripheral portion of the substrate WF based on the diameter of the substrate WF measured by the measuring step 120.

Subsequently, the substrate processing method pushes the polishing pad 222 to the substrate WF while rotating the polishing pad 222 to swing the polishing pad 222 (swinging step 140). According to this embodiment, the positions of the supporting members 300 in the horizontal direction can be adjusted according to the measured actual diameter of the substrate WF, and therefore the supporting members 300 can be disposed at the positions close to the outer peripheral portion of the substrate WF. As a result, according to this embodiment, even when the tolerance is present in the diameter of the substrate WF, the uniformity in the polishing of the polished surface of the substrate WF can be improved.

Figure 11:
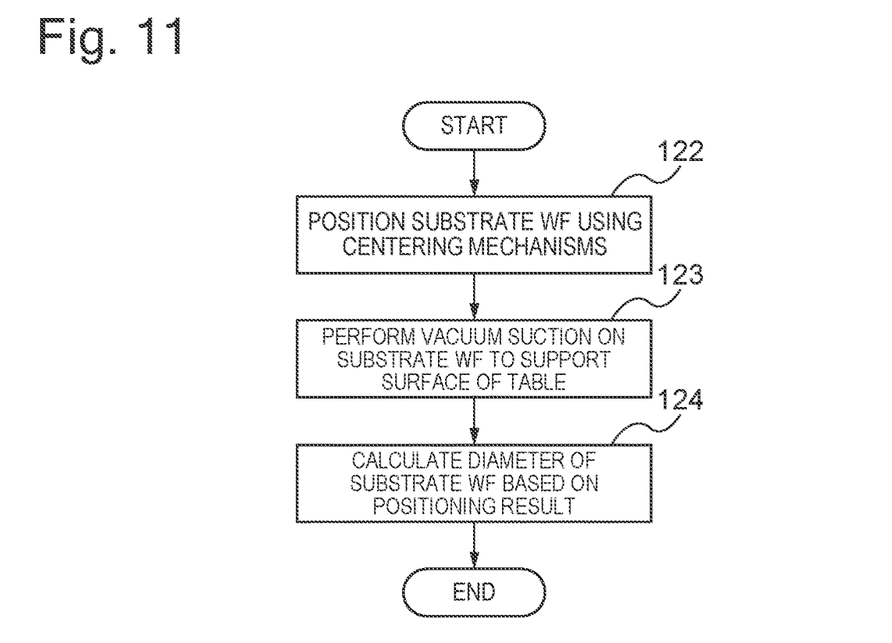
FIG. 11 is a flowchart for describing details of a measuring step.

FIG. 11 is a flowchart for describing the details of the measuring step. As illustrated in FIG. 11, in the measuring step 120, the substrate processing method positions the substrate WF using the centering mechanisms 400A, 400B, 400C (positioning step 122). The positioning of the substrate WF using the centering mechanisms 400A, 400B, 400C may be positioning of the substrate WF using the centering members 420 as described above or may be positioning of the substrate WF using the centering members 440. Subsequently, the substrate processing method performs vacuum suction on the substrate WF to the support surface 100a of the table 100 via the plurality of holes 102 in a state where the positioning of the substrate WF in the positioning step 122 is completed to surely fix the substrate WF (vacuum suction step 123). Note that the vacuum suction step 123 is performed immediately after the positioning step 122 in this embodiment, but the order is not limited to this, and the vacuum suction step 123 can be performed until before the polishing of the substrate WF in the swinging step 140.

Subsequently, the substrate processing method calculates the diameter of the substrate WF based on the positioning result of the substrate WF in the positioning step 122 (calculating step 124). Specifically, as described above, the calculating step 124 may calculate the diameter of the substrate WF based on the positioning result when the positioning is performed on the substrate WF using the centering members 420 or may calculate the diameter of the substrate WF based on the positioning result when the positioning is performed on the substrate WF using the centering members 440. While this embodiment describes the example of calculating the diameter of the substrate WF based on the positioning result of the substrate WF, but the method is not limited to this. The diameter of the substrate WF may be calculated using the imaging member (camera) 252 or the diameter of the substrate WF may be measured before the installation of the table 100 by another method.

In the foregoing, several embodiments of the present invention have been described above in order to facilitate understanding of the present invention without limiting the present invention. The present invention can be changed or improved without departing from the gist thereof, and of course, the equivalents of the present invention are included in the present invention. It is possible to arbitrarily combine or omit respective components described in the claims and specification in a range in which at least a part of the above described problems can be solved, or a range in which at least a part of the effects can be exhibited.

This application discloses a substrate processing apparatus as one embodiment that includes a table, a pad holder, a swing mechanism, a supporting member, a measuring instrument, and a driving mechanism. The table supports a substrate. The pad holder holds a polishing pad. The polishing pad polishes the substrate supported to the table. The swing mechanism swings the pad holder. The supporting member supports the polishing pad swung to outside the table by the swing mechanism. The measuring instrument is configured to measure a diameter of the substrate. The driving mechanism adjusts a position of the supporting member with respect to the substrate supported to the table according to the diameter of the substrate measured by the measuring instrument.

This application further discloses the following substrate processing apparatus as one embodiment. The supporting member includes a first supporting member and a second supporting member. The first supporting member is disposed on a swing path of the polishing pad outside the table. The second supporting member is disposed on a swing path of the polishing pad on a side opposite to the first supporting member between which the table is interposed.

This application further discloses the following substrate processing apparatus as one embodiment. The first supporting member and the second supporting member each have a support surface. The support surfaces are configured to support an entire polishing surface of the polishing pad in contact with the substrate.

This application further discloses the following substrate processing apparatus as one embodiment. The measuring instrument includes an imaging member. The imaging member is configured to obtain an image of an outer peripheral portion of the substrate supported to the table. The measuring instrument is configured to calculate the diameter of the substrate based on the image obtained by the imaging member.

This application further discloses the following substrate processing apparatus as one embodiment. The measuring instrument includes at least three centering mechanisms. The at least three centering mechanisms push the substrate supported to the table in a center direction of the table for positioning. The measuring instrument is configured to calculate the diameter of the substrate based on a positioning result of the substrate with the centering mechanisms.

This application further discloses the following substrate processing apparatus as one embodiment. The at least three centering mechanisms each include a shaft and a centering member. The shafts are disposed around the table and movable in a direction of approaching the table and a direction of away from the table. The centering members are mounted to the shafts. The measuring instrument is configured to calculate the diameter of the substrate based on movement amounts of the shafts when the substrate is positioned.

This application further discloses the following substrate processing apparatus as one embodiment. The at least three centering mechanisms each include a rotation shaft and a centering member. The rotation shafts are disposed around the table. The centering members are mounted to the rotation shafts. The centering member includes a first contact portions and a second contact portion. The first contact portions contact the substrate when the rotation shafts rotate in a first direction. The second contact portions contact the substrate when the rotation shafts rotate in a second direction opposite to the first direction.

This application further discloses the following substrate processing apparatus as one embodiment. The measuring instrument is configured to calculate the diameter of the substrate based on rotation angles in the first direction of the rotation shafts or rotation angles in the second direction of the rotation shafts when the substrate is positioned.

This application further discloses the following substrate processing apparatus as one embodiment. The swing mechanism includes an arm, a swing shaft, and a rotation drive mechanism. The arm holds the pad holder. The swing shaft supports the arm. The rotation drive mechanism rotatably drives the swing shaft. The arm includes a first arm, a second arm, a third arm, and a fourth arm. The first arm holds the polishing pad. The second arm holds a cleaning tool. The third arm holds a polishing pad different from the polishing pad in diameter. The fourth arm holds the imaging member. The first, the second, the third, and the fourth arms are each radially arranged around the swing shaft.

This application further discloses the following substrate processing apparatus as one embodiment. The second arm further holds atomizers disposed on both sides of the cleaning tool together with the cleaning tool.

This application further discloses a substrate processing method as one embodiment that includes an installing step of installing a substrate to a table; a measuring step of measuring a diameter of the substrate; a swinging step of swinging a polishing pad that polishes the substrate installed to the table; and an adjusting step of adjusting a position of a supporting member that supports the polishing pad swung to outside the table by the swinging step with respect to the substrate installed to the table according to the diameter of the substrate measured by the measuring step.

This application further discloses the following method as one embodiment. The measuring step includes: a positioning step of pushing the substrate installed to the table in a center direction of the table using at least three centering mechanisms disposed around the table to position the substrate; and a calculating step of calculating the diameter of the substrate based on a positioning result of the substrate in the positioning step.

REFERENCE SIGNS LIST

100 . . . table
200 . . . multi-axis arm
210 . . . swing shaft
212 . . . rotation drive mechanism
220 . . . first arm
222 . . . polishing pad
222a . . . polishing surface
226 . . . pad holder
230 . . . second arm
232 . . . cleaning tool
238 . . . atomizer
240 . . . third arm
242 . . . polishing pad
246 . . . pad holder
250 . . . fourth arm
252 . . . imaging member (camera)
300 . . . supporting member
300A . . . first supporting member
300B . . . second supporting member
301a . . . support surface
301b . . . support surface
320 . . . driving mechanism
400 . . . measuring instrument
400A, 400B, 400C . . . centering mechanism
410 . . . shaft
420 . . . centering member
430 . . . rotation shaft
440 . . . centering member
440a . . . first contact portion
440b . . . second contact portion
1000 . . . substrate processing apparatus
WF . . . substrate

What is claimed is:

1. A substrate processing apparatus comprising:
a table for supporting a substrate;
a pad holder for holding a polishing pad for polishing the substrate supported to the table;
a swing mechanism configured to swing the pad holder;
a supporting member for supporting the polishing pad swung to outside the table by the swing mechanism;
a measuring instrument configured to measure a diameter of the substrate; and
a driving mechanism for adjusting a position of the supporting member with respect to the substrate supported to the table according to the diameter of the substrate measured by the measuring instrument,
wherein the supporting member includes a first supporting member and a second supporting member, the first supporting member is disposed on a swing path of the polishing pad outside the table, and the second supporting member is disposed on a swing path of the polishing pad on a side opposite to the first supporting member between which the table is interposed, the first supporting member and the second supporting member each have a support surface, and the support surfaces each have an area larger than an area of a polishing surface of the polishing pad.

2. The substrate processing apparatus according to claim 1, wherein the measuring instrument includes an imaging member, the imaging member is configured to obtain an image of an outer peripheral portion of the substrate supported to the table, and the measuring instrument is configured to calculate the diameter of the substrate based on the image obtained by the imaging member.

3. The substrate processing apparatus according to claim 1, wherein the measuring instrument includes at least three centering mechanisms, the at least three centering mechanisms push the substrate supported to the table in a center direction of the table for positioning, and the measuring instrument is configured to calculate the diameter of the substrate based on a positioning result of the substrate with the centering mechanisms.

4. The substrate processing apparatus according to claim 3, wherein the at least three centering mechanisms each include a shaft and a centering member, the shafts are disposed around the table and movable in a direction of approaching the table and a direction of away from the table, and the centering members are mounted to the shafts, and the measuring instrument is configured to calculate the diameter of the substrate based on movement amounts of the shafts when the substrate is positioned.

5. A substrate processing apparatus comprising:

a table for supporting a substrate;

a pad holder for holding a polishing pad for polishing the substrate supported to the table;

a swing mechanism configured to swing the pad holder;

a supporting member for supporting the polishing pad swung to outside the table by the swing mechanism;

a measuring instrument configured to measure a diameter of the substrate; and a driving mechanism for adjusting a position of the supporting member with respect to the substrate supported to the table according to the diameter of the substrate measured by the measuring instrument, wherein the measuring instrument includes at least three centering mechanisms, the at least three centering mechanisms push the substrate supported to the table in a center direction of the table for positioning, and the measuring instrument is configured to calculate the diameter of the substrate based on a positioning result of the substrate with the centering mechanisms, the at least three centering mechanisms each include a rotation shaft and a centering member, the rotation shafts are disposed around the table, and each of the centering members is a rod-shaped member mounted to the rotation shafts and extends to both sides of the rotation shaft, and the centering member includes a first contact portions and a second contact portion, the first contact portions contact the substrate when the rotation shafts rotate in a first direction, and the second contact portions contact the substrate when the rotation shafts rotate in a second direction opposite to the first direction.

6. The substrate processing apparatus according to claim 5, wherein the measuring instrument is configured to calculate the diameter of the substrate based on rotation angles in the first direction of the rotation shafts or rotation angles in the second direction of the rotation shafts when the substrate is positioned.

7. A substrate processing apparatus comprising:

a table for supporting a substrate;

a pad holder for holding a polishing pad for polishing the substrate supported to the table;

a swing mechanism configured to swing the pad holder;

a supporting member for supporting the polishing pad swung to outside the table by the swing mechanism;

a measuring instrument configured to measure a diameter of the substrate; and a driving mechanism for adjusting a position of the supporting member with respect to the substrate supported to the table according to the diameter of the substrate measured by the measuring instrument, wherein the measuring instrument includes an imaging member, the imaging member is configured to obtain an image of an outer peripheral portion of the substrate supported to the table, and the measuring instrument is configured to calculate the diameter of the substrate based on the image obtained by the imaging member, the swing mechanism includes an arm, a swing shaft, and a rotation drive mechanism, the arm holds the pad holder, the swing shaft supports the arm, and the rotation drive mechanism rotatably drives the swing shaft, the arm includes a first arm, a second arm, a third arm, and a fourth arm, the first arm holds the polishing pad, the second arm holds a cleaning tool, the third arm holds a polishing pad different from the polishing pad in diameter, and the fourth arm holds the imaging member, and the first, the second, the third, and the fourth arms are each radially arranged around the swing shaft.

8. The substrate processing apparatus according to claim 7, wherein the second arm further holds atomizers disposed on both sides of the cleaning tool together with the cleaning tool.

* * * * *